United States Patent
Sampayan

(10) Patent No.: US 9,419,721 B2
(45) Date of Patent: Aug. 16, 2016

(54) WIDE BANDGAP MATRIX SWITCHER, AMPLIFIER AND OSCILLATOR

(71) Applicant: Lawrence Livermore National Security, LLC, Livermore, CA (US)

(72) Inventor: Stephen Sampayan, Manteca, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 123 days.

(21) Appl. No.: 14/218,895

(22) Filed: Mar. 18, 2014

(65) Prior Publication Data

US 2014/0270777 A1   Sep. 18, 2014

Related U.S. Application Data

(60) Provisional application No. 61/802,330, filed on Mar. 15, 2013.

(51) Int. Cl.

| | |
|---|---|
| H04B 10/00 | (2013.01) |
| H04B 10/548 | (2013.01) |
| H03B 17/00 | (2006.01) |
| G05F 5/00 | (2006.01) |
| H04J 14/00 | (2006.01) |
| H04B 10/50 | (2013.01) |
| H03C 1/34 | (2006.01) |
| H03C 7/02 | (2006.01) |
| H04B 10/2575 | (2013.01) |
| H03F 3/08 | (2006.01) |

(52) U.S. Cl.
CPC .............. *H04B 10/548* (2013.01); *G05F 5/00* (2013.01); *H03B 17/00* (2013.01); *H03C 1/34* (2013.01); *H03C 7/02* (2013.01); *H03F 3/08* (2013.01); *H04B 10/2575* (2013.01); *H04B 10/505* (2013.01); *H04J 14/00* (2013.01)

(58) Field of Classification Search
CPC ............... H04B 10/2575–10/25759; H04B 10/29–10/299; H04B 10/80; H01C 10/00; H01L 27/15; H01L 27/30; H03C 1/34
USPC .......................................... 398/76, 115–117
See application file for complete search history.

(56) References Cited

U.S. PATENT DOCUMENTS

| | | | |
|---|---|---|---|
| 3,564,355 A * | 2/1971 | Lehovec | B01J 7/02 257/66 |
| 3,906,166 A | 9/1975 | Cooper et al. | |
| 5,333,178 A | 7/1994 | Norell | |
| 5,494,643 A * | 2/1996 | Kennedy, III | B01J 19/122 422/186 |
| 5,544,225 A | 8/1996 | Kennedy, III et al. | |
| 5,546,444 A | 8/1996 | Roach, Jr. et al. | |
| 5,771,455 A | 6/1998 | Kennedy, III et al. | |
| 5,794,144 A | 8/1998 | Comer et al. | |
| 6,094,458 A * | 7/2000 | Hellberg | H03F 3/24 341/143 |
| 6,125,275 A | 9/2000 | Comer et al. | |

(Continued)

FOREIGN PATENT DOCUMENTS

WO   2010/129804 A1   11/2010

*Primary Examiner* — Li Liu
(74) *Attorney, Agent, or Firm* — Perkins Coie LLP

(57) ABSTRACT

An electronic device comprising an optical gate, an electrical input an electrical output and a wide bandgap material positioned between the electrical input and the electrical output to control an amount of current flowing between the electrical input and the electrical output in response to a stimulus received at the optical gate can be used in wideband telecommunication applications in transmission of multi-channel signals.

12 Claims, 10 Drawing Sheets

(56) References Cited

U.S. PATENT DOCUMENTS

| | | | |
|---|---|---|---|
| 6,154,648 A | 11/2000 | Comer | |
| 6,272,351 B1 | 8/2001 | Langston et al. | |
| 6,311,056 B1 | 10/2001 | Sandidge | |
| 9,130,047 B2* | 9/2015 | Sakakura | H01L 29/7869 |
| 9,142,339 B2* | 9/2015 | Sampayan | H01C 1/00 |
| 2004/0185672 A1* | 9/2004 | Polichar | H01L 27/14658 438/720 |
| 2005/0249249 A1* | 11/2005 | Pettit | B82Y 10/00 372/20 |
| 2006/0054922 A1* | 3/2006 | Pettit | B82Y 10/00 257/116 |
| 2009/0261258 A1* | 10/2009 | Harris | H03C 1/34 250/370.01 |
| 2013/0181646 A1* | 7/2013 | Takata | H02M 1/12 318/400.29 |
| 2014/0263976 A1* | 9/2014 | Sampayan | H03C 7/025 250/208.4 |
| 2014/0263979 A1 | 9/2014 | Guethlein | |
| 2014/0284451 A1* | 9/2014 | Sampayan | H03C 1/34 250/206 |
| 2015/0028674 A1* | 1/2015 | Sampayan | H02M 7/12 307/43 |

* cited by examiner

WIDE BANDGAP MATRIX SWITCHER, AMPLIFIER AND OSCILLATOR

CROSS-REFERENCE TO RELATED APPLICATIONS

This patent document claims benefit of priority of U.S. Provisional Patent Application No. 61/802,330, entitled "WIDE BANDGAP MATRIX SWITCHER, AMPLIFIER AND OSCILLATOR", and filed on Mar. 15, 2013. The entire content of the aforementioned patent application is incorporated by reference as part of the disclosure of this patent document.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to circuits, analog devices and telecommunication technologies.

BACKGROUND

Electronic circuits in most applications are based on electronic circuit elements, such as resistors, capacitors, inductors, transistors, diodes and other circuit modules including amplifiers, oscillators, and switches that are based on the above circuit elements. Such circuits can be implemented in various configurations and can be used in various applications. For example, with the ever growing need for compact telecommunication equipment, there is a growing demand for efficient ways in which receiver and transmitter functions can be implemented.

SUMMARY

The circuits and devices described in this patent document include photonic devices having wide bandgap materials which change electrical behaviors in response to light. The light incident to the wide bandgap material can be controlled or modulated in operations of various circuits and devices disclosed for effectuating various circuit functions.

In one exemplary aspect an electronic device comprising an optical gate, an electrical input, an electrical output and a wide bandgap material positioned between the electrical input and the electrical output to control an amount of current flowing between the electrical input and the electrical output in response to a stimulus received at the optical gate is disclosed.

DETAILED DESCRIPTION

Figure 1A:
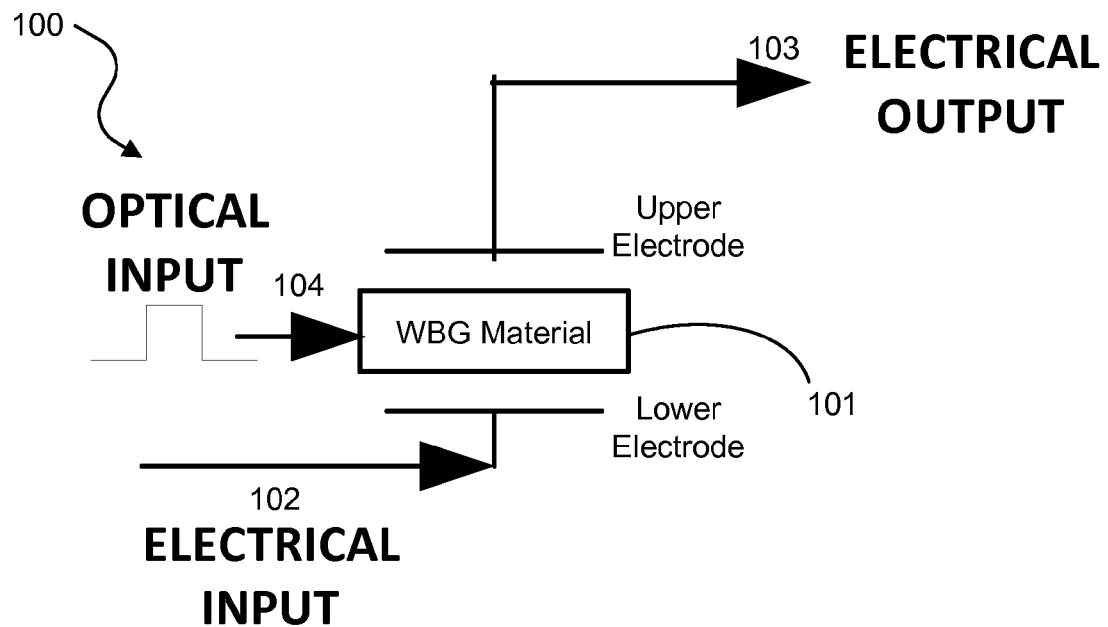
FIGS. 1A, 1B, 2A, 2B, 3, 4, 5A, 5B, 6 and 7 show diagrams of examples of various electrical devices based on a wide bandgap photoconductive material of the disclosed technology.

Disclosed are circuits, devices, systems, and methods using wide bandgap materials modulated by applied radiation such as laser light. The disclosed technology can have significant applications in communications, telecommunications, telecommunications switching, and general analog electronics.

Electronic circuits in most applications are based on electronic circuit elements, such as resistors, capacitors, inductors, transistors, diodes and others. The circuits and devices disclosed here use photoconductive switches based on wide bandgap (WBG) materials that are activated by radiation such as laser light and can be controlled by modulating or controlling the power or intensity of the radiation. Such a WBG photoconductive switch can include a substrate of a photoconductive WBG material placed in contact with and located between two electrodes. In absence of light or at a low light level below a threshold, the photoconductive WBG material behaves as an insulator with a large resistance value (e.g., much larger than the circuit impedance) and thus essentially blocks the current flow across the two electrodes in contact with the photoconductive WBG material. When optical energy is directed into the WBG material and absorbed, the WBG material produces charge carriers from the absorbed light to become electrically conductive and the resistance drops to a small value (much less than the circuit impedance). One or more radiation beams can be used to illuminate the WBG material. In some implementations, the input may be made with a multiplicity of optical inputs so that a combination of the effects of the multiple optical inputs occur simultaneously on the output. The switching time of such a WBG photoconductive switch can be short, e.g., several nanoseconds in some implementations. Such photoconductive switches can be designed and structured to handle high voltages and high currents with reduced inductance to provide rapid switching operations or modulation operations, and precise temporal control.

Because of the extremely large current densities and high electrical field stress such wide bandgap materials can sustain, very high peak power can be modulated. In some aspects, highly compact analog devices are disclosed having similar or improved transfer characteristics as existing analog components, e.g., such as vacuum tubes and semiconductor transistors. Thus, highly compact analog devices based on disclosed WBG photoconductive switches can be implemented in applications that may replace many transistors and vacuum tubes. In addition, the disclosed technology can be used to provide a new class of single stage high voltage amplifiers and oscillators. Further, because of advancements in optical computers or optical information processing devices or systems, the WBG photoconductive switches based on the disclosed technology can provide the optical-electrical interface to or with standard electrical systems. For instance, it is possible to mix signals using the disclosed technology so as to develop a composite transmitted signal. Such a device would be similar in operation, if not an improvement to the operation of a multi-grid vacuum used for frequency mixing. Furthermore, extension of this technology provides that similar geometries are realizable.

The present patent document discloses a bulk wide bandgap (WBG) device technology without a voltage source shown in several exemplary embodiments as discussed below. In some aspects, the disclosed wide bandgap electronic devices include a gate, an electrical input, and an electrical output, in which the gate comprises a wide bandgap material positioned between the electrical input and the electrical output to control an amount of current flowing between the electrical input and the electrical output in response to a stimulus received at the gate. Such devices are sometimes referred to herein as wide bandgap transconductance devices (WBTD). In some implementations, for example, the stimulus can include an optical signal or an x-ray signal. In some implementations, for example, the stimulus can include a telecommunications signal so that the stimulus varies with the telecommunications signal.

In some implementations, for example, the wide bandgap material can include silicon carbide (SiC) or other wide bandgap photoconductive materials. Silicon carbide (SiC) has a high dielectric breakdown strength, greater than that of most solid materials (about 4 MV/cm); high thermal conductivity (comparable to that of copper); and low optical absorption. Single crystalline Silicon Carbide materials can be used to implement a WBG photoconductive switch in circuits and devices disclosed herein. Some examples of WBG photoconductive switches are disclosed in patent filings by Lawrence Livermore National Security, LLC, including U.S. patent application Ser. No. 13/830,741, entitled "PHOTOCONDUCTIVE SWITCH WITH IMPROVED LIFE SPAN", filed on Mar. 14, 2013, PCT publication No. WO2010129804 A1, entitled "PHOTOCONDUCTIVE SWITCH PACKAGE" based on PCT application PCT/US2010/033923 filed May 6, 2010, which are incorporated by reference in their entirety as part of the disclosure of this patent document.

FIG. 1A shows a diagram of an exemplary wide bandgap electrical device 100 of the disclosed technology. The device 100 includes an optical switch element 101 located between and in contact with upper and lower electrodes, shown in FIG. 1A as a single switch element. In some implementations, the optical switch element 101 of the device 100 can be configured as a matrix array of switch elements 101. The device 100 includes an electrical input 102 and an electrical output 103 positioned on opposite sides of the switch element 101. In operation, the device 100 can utilize an optical input 104 such as optical radiation to alter the conductive properties of the optical switch 101, e.g., inducing the electrical conduction of the switch. The optical input 104 can be modulated to affect the functional properties of the optical switch 101 and thereby control an amount of the current flowing between the upper and lower electrodes to produce the electrical output 103 based on the electrical input 102. The device 100 can be utilized without requiring an active power supply. For example, the switch 101 can be used for switching or routing of a multiplicity of signals depending on the applied optical input 104.

Figure 1B:
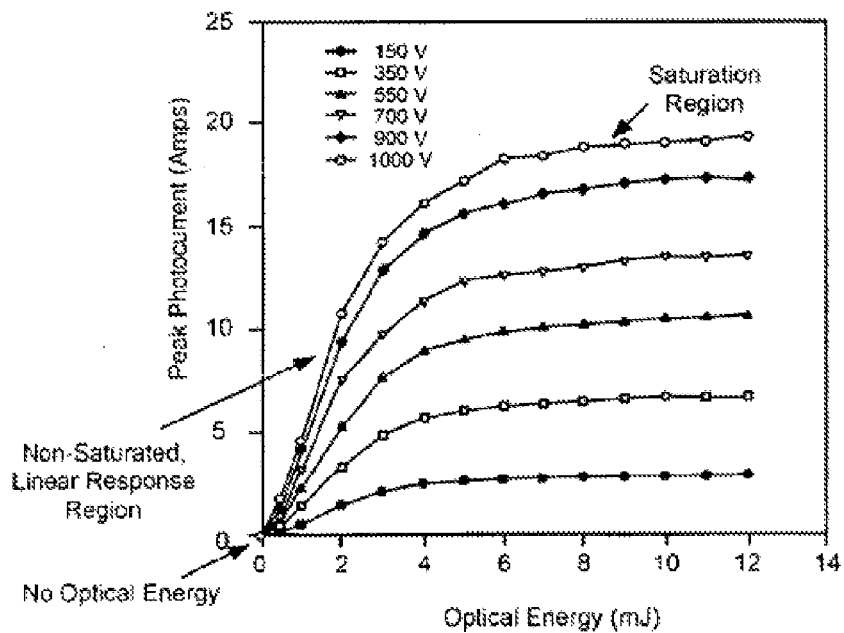

FIG. 1B shows examples of photoconductive currents of SiC under the influence of visible optical energy at various optical energies and electrical voltages across the SiC from experiments performed by Applicants at Lawrence Livermore National Laboratory. On the x-axis is the intensity of the visible optical energy onto the SiC material. The resultant current flow is shown on the y-axis for multiple voltages applied across the material. FIG. 1B shows details of the currents through the SiC switch at various voltages resulting from changing the optical intensity to the switch, and shows high current (>1 kA/cm) capability of wide band gap materials (SiC and GaN) under high gradient (>27 MV/m) switching applications. For approximately a change from 0 to 2 mj in optical energy, the device operates in an essentially linear mode from a dark current of about 1 nA to peak current. For this particular data this current was about 20 A at 1 kV. At higher optical energy >2 mJ, a saturation point is reached where the device achieves a minimum resistance of about 1.OMEGA. The conduction response curve shown in FIG. 2 can be characterized as having a saturated region, and a non-saturated region. The data in FIG. 1B shows that the non-saturated region has a substantially linear response that is similar to a typical transistor device. The tested SiC material operates with a transconductance like property of the form: Gm=Iout/in, where in is the controlling input parameter. In the case of a simple transistor, .zeta.in, would be the base current or for a vacuum tube, the control grid voltage. For the SiC material, this parameter is the optical or other radiation energy producing a conduction response. Although the very linear, lower current region was illustrated for clarity, SiC exhibits this transconductance property beyond the maximum current greater than 1 kA/cm$^2$ in the tested devices. And as with transistor and vacuum tube technologies these materials exhibit a steep high gain linear regime from 0-2 mj and a decreased slope saturation region up to >30 mJ. Thus, when the material is operated in the substantially linear non-saturated region, amplification of an applied modulation to the optical pulse will result in amplification of the applied signal. When properly configured, these switches are able to close and open on timescales of nanoseconds or faster, i.e. high frequency modulation.

Figures 2A, 2B:
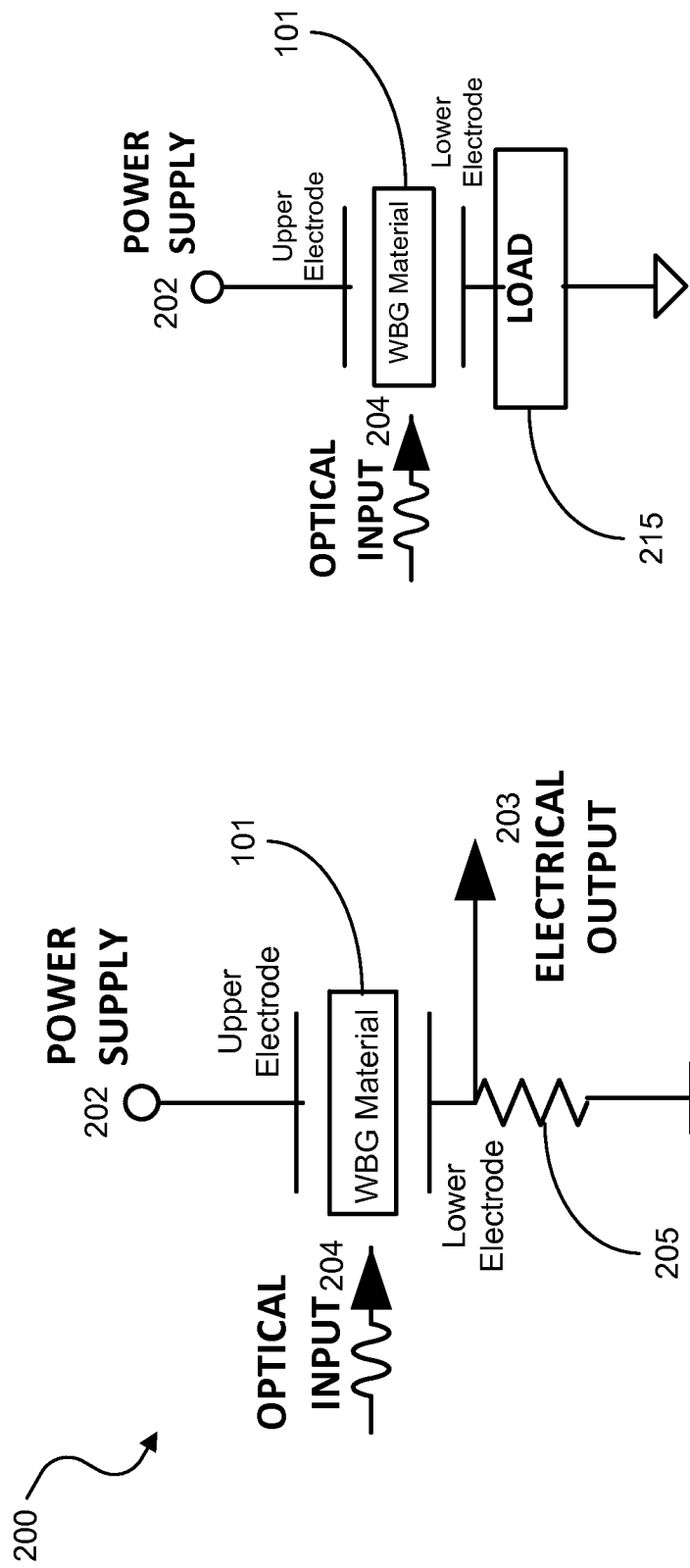

FIG. 2A shows a diagram of an exemplary wide bandgap electrical device 200 of the disclosed technology that can operate as a follower circuit that allows at least one of the electrodes to follow the input signal. The device 200 includes the optical switch element 101 positioned between an electrical power supply 202 coupled to the upper electrode and an electrical output 203 coupled to the lower electrode of the switch element 101. In operation, the device 200 can utilize an optical input 204 including a modulated optical signal to alter the conductive properties of the optical switch 101 to control an amount of the current flowing between the upper and lower electrodes under the power supply 202 to produce the electrical output 203. The device 200 includes an electrical circuit 205 (e.g., impedance element, such as a resistor) electrically coupled between the lower electrode and the ground.

FIG. 2B shows another example of a wide bandgap electrical device as a follower circuit that allows at least one of the electrodes to follow the input signal. This device includes the optical switch element 101 positioned between an electrical power supply 202 and an electrical load element 215 coupled between the lower electrode and the ground. In operation, the device can utilize an optical input 204 including a modulated optical signal to alter the conductive properties of the optical switch 101 to control an amount of the current flowing between the power supply 202 and the load 215.

Figure 3:
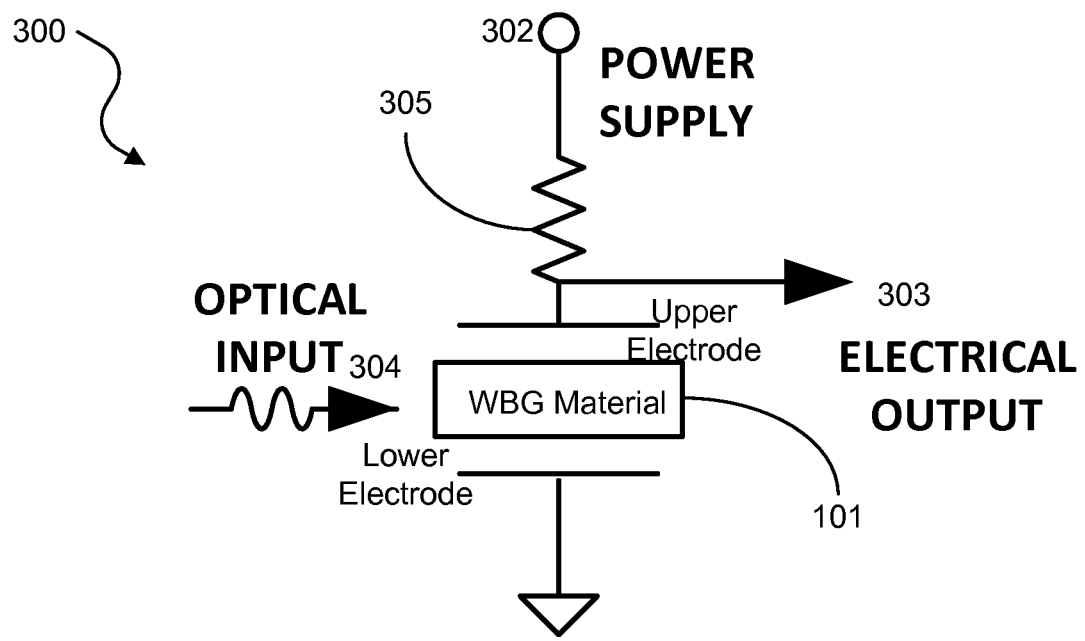

FIG. 3 shows a diagram of an exemplary wide bandgap electrical device 300 of the disclosed technology that can operate as an amplifier circuit. The device 300 includes the optical switch element 101 electrically coupled to an electrical power supply 302 via an electrical circuit element 305 between the power supply 302 and the upper electrode of the optical switch element 101. The electrical output 303 is generated at a location between the electrical circuit element 305 and the upper electrode of the switch element 101. In the illustrated example, the lower electrode is coupled to the ground. In operation, the device 300 can utilize an optical input 304 including a modulated optical signal to alter the conductive properties of the optical switch 101 to control an amount of the current flowing between the upper and lower electrodes under the power supply 302 to produce the electrical output 303. In some implementations, for example, the circuit element 305 can include an impedance element, such as a resistor, or other circuit element(s) to cause amplification of the electric signal at the electrical output 303.

Figure 4:
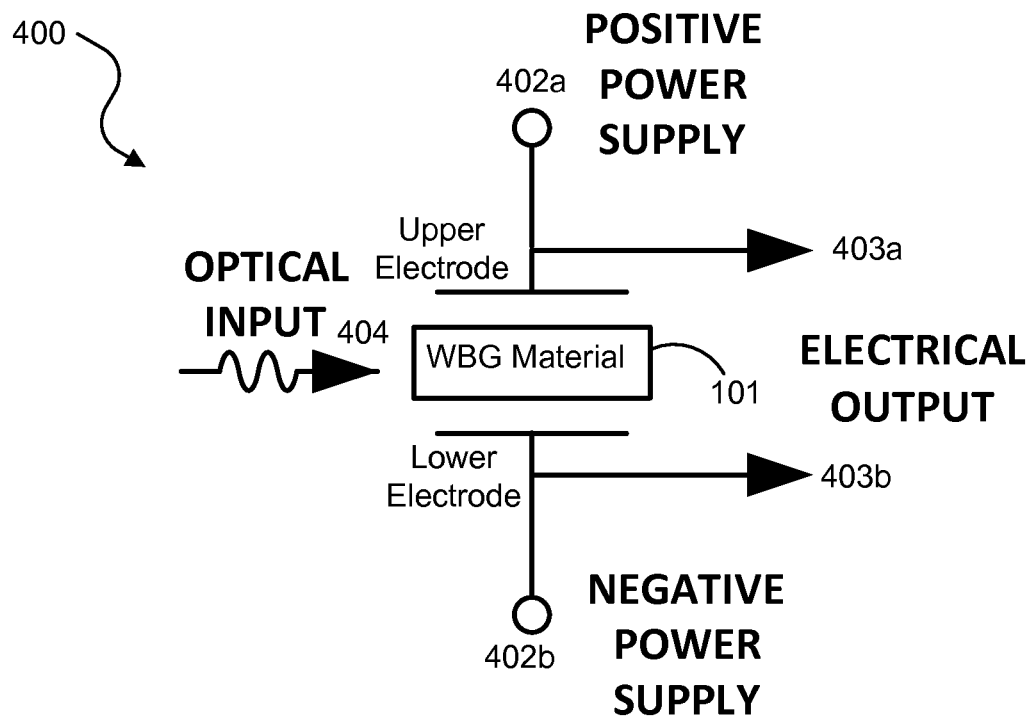

FIG. 4 shows a diagram of an exemplary wide bandgap electrical device 400 of the disclosed technology operable as a shunt type WBG bi-polar, balanced output, waveform generator. The device 400 includes the optical switch element 101 positioned between a positive power supply 402a and a negative power supply 402b of a more negative polarity than the power supply 402a. The device 400 includes two connections of an electrical output 403, in which one connection is between the power supply 402a and the upper electrode and the other connection is between the lower electrode and the power supply 402b. In operation, the device 400 can utilize an optical input 404 including a modulated optical signal to alter the conductive properties of the optical switch 101 to control an amount of the current flowing between the upper and lower electrodes under the two power supplies 402a and 402b to generate a balanced output waveform on the electrical output 403.

Although the power supply 402b is denoted as the "NEGATIVE POWER SUPPLY" in FIG. 4, the power supply 402b can also be of positive polarity, but slightly more negative than the power supply 402a, denoted as "POSITIVE POWER SUPPLY" in FIG. 4. For example, the waveform would vary about some value between those potentials. And likewise, although the power supply 402a is denoted as the "POSITIVE POWER SUPPLY" in FIG. 4, it is understood that the power supply 402a can also be of negative polarity, but slightly more positive than the power supply 402b, denoted as "NEGATIVE POWER SUPPLY" in FIG. 4. For example, the waveform would vary about some value between those potentials.

Figure 5A:
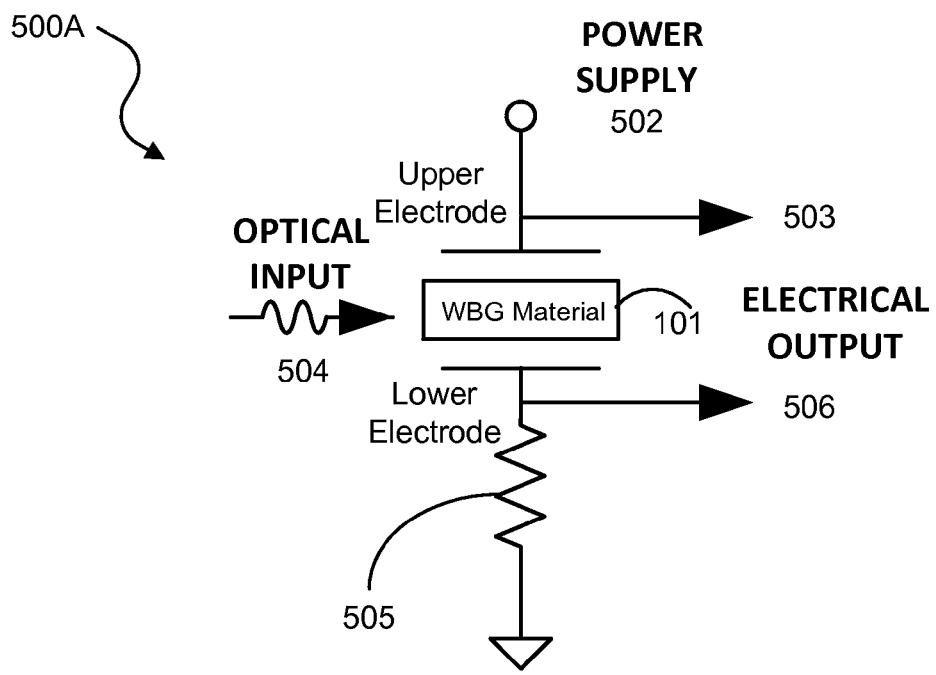

FIG. 5A shows a diagram of an exemplary wide bandgap electrical device 500A of the disclosed technology operable as a shunt type floating ground balanced waveform generator. Different from the device in FIG. 4, the power suppler coupled to the lower electrode in FIG. 4 is now replaced by a circuit 505 which can be an impedance element, such as a resistor, between the lower electrode and the ground. The electrical output is based on the electrical signal 503 between the upper electrode and the power supply 502 and the electrical signal 506 between the lower electrode and the impedance circuit 505.

Figure 5B:
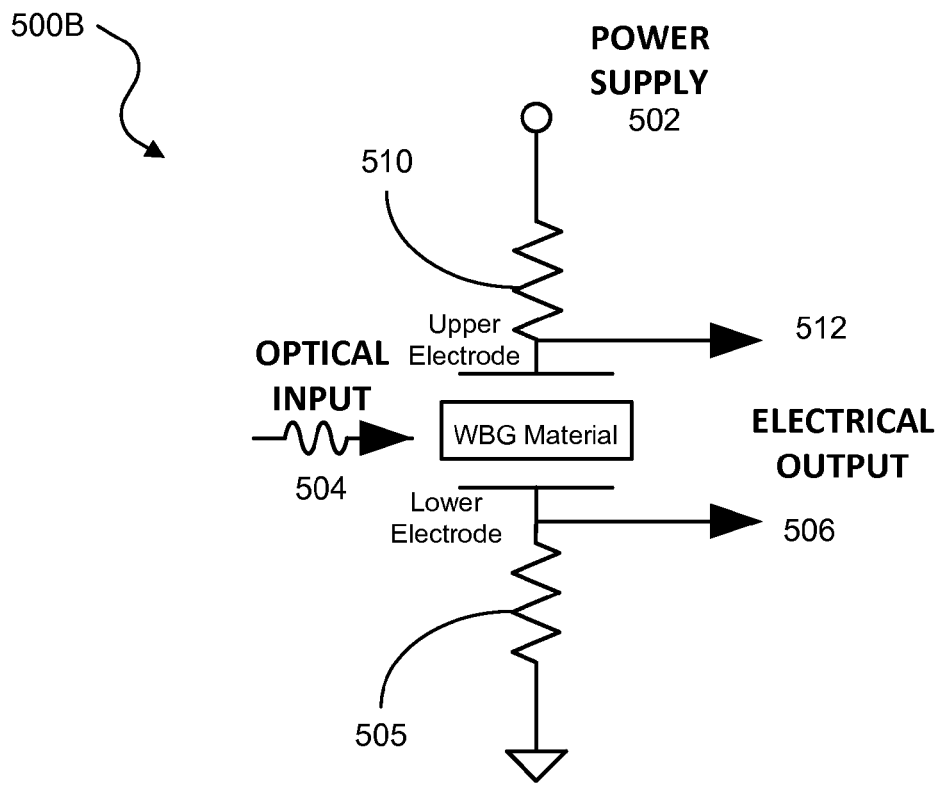

FIG. 5B shows a diagram of another exemplary wide bandgap electrical device 500B of the disclosed technology operable as a shunt type floating ground balanced waveform generator. In comparison with the circuit in FIG. 5A, the device 500B includes a second circuit element 510 (such as an impedance circuit like a resistor) coupled between the upper electrode and the power supply 502 where a signal 512 is taken out between the upper electrode and the circuit 510. This signal 512 and the signal 560 from the lower electrode are used to generate the output signal.

Figure 6:
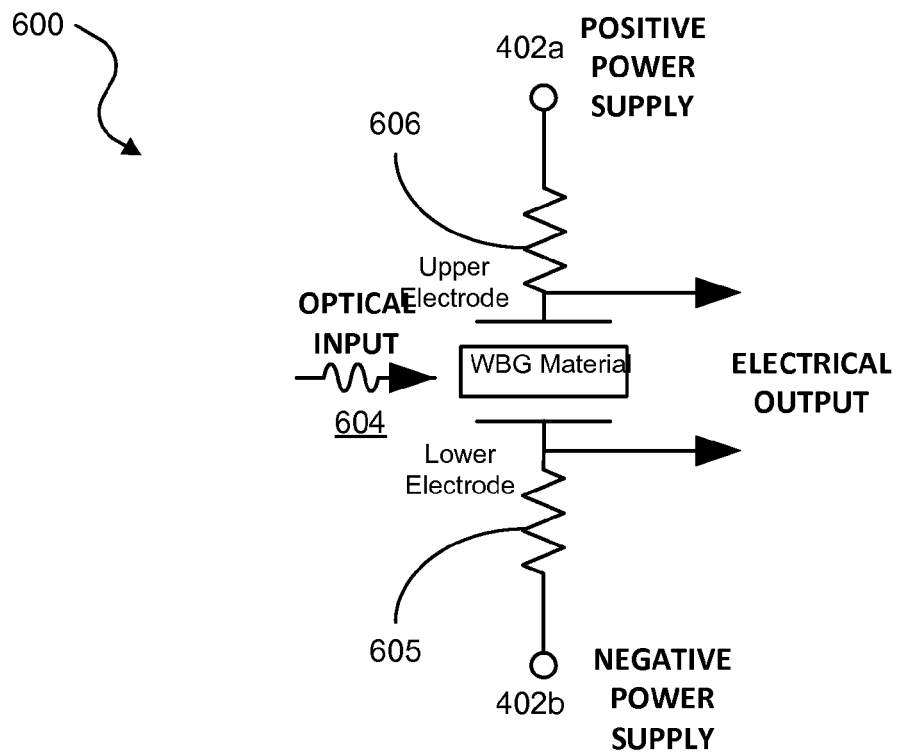

FIG. 6 shows a diagram of another exemplary wide bandgap electrical device 600 of the disclosed technology operable as a shunt type WBG bi-polar, balanced output, waveform generator. The device 600 is based on features in FIGS. 4, 5A and 5B by including impedance circuits 606 and 605 in the upper and lower electrode sides of the optical switch element 101 under two power supplies 402a and 402b of a more negative polarity than the power supply 402a as in FIG. 4.

Figure 7:
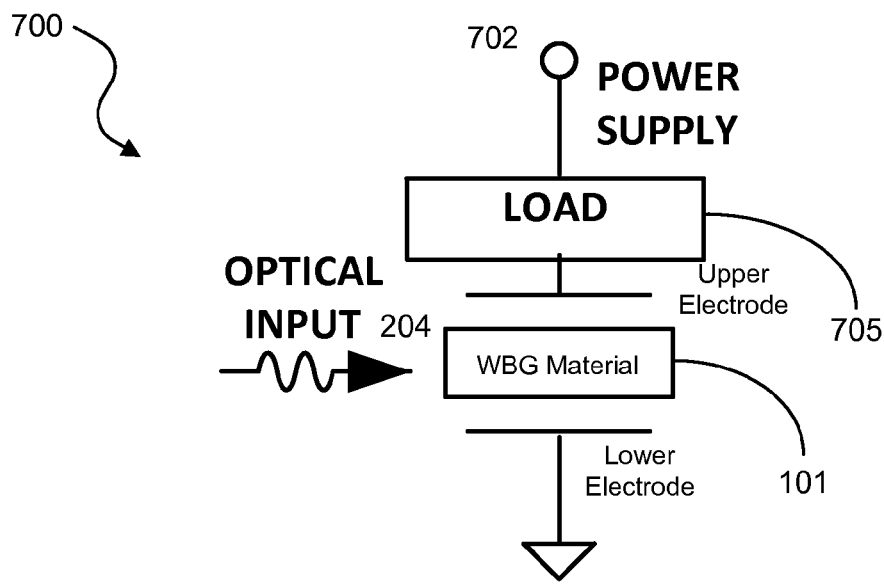

FIG. 7 shows a diagram of an exemplary wide bandgap electrical device 700 of the disclosed technology that can operate as an amplifier circuit. The device 700 includes an electrical power supply 702 and an electrical load element 705 coupled between the power supply 702 and the upper electrode of the optical switch element 101. In operation, the device 700 can utilize an optical input 204 including a modulated optical signal to alter the conductive properties of the optical switch 101 to control an amount of the current flowing from the power supply 702 across the load 705 to amplify the electrical signal.

Other variants of the exemplary embodiments disclosed in FIGS. 1 to 7 are possible. For example, in each one of these embodiments as shown in FIGS. 1 to 7, the load can be placed anywhere in the main current path to achieve the desired result. For instance, the load can replace the exemplary circuit elements (e.g., resistor(s) shown) or be placed in series with the exemplary resistor(s) shown.

Although the word "optical" input is used, it is clear that different forms of radiation can be used, e.g., x-ray radiation, microwave radiation, to modulate the current flow in the photoconductive material.

Each one of these exemplary devices can also be interfaced to receive an optical output from an optical processing device or an optical computer and thus can be controlled by the optical output from an optical computer to enable the direct control of electrical systems determined by the optical system. The disclosed WBG devices can be useful to telecommunications, vacuum tube, and high voltage transistor replacement, high power solid-state electronics, communications, analog electronics, RF weapon applications, compact pulsed power sources, high voltage drivers with general applicability, among other applications.

Various oscillators or oscillation systems may be constructed based on the disclosed technology. In each one of the exemplary embodiments depicted in FIGS. 1 to 7, it is possible to initiate and sustain self-oscillations by sampling the output and converting that output to an optical modulation which is applied in a regenerative way to the optical input. Such a system would be a WBG device oscillator of the disclosed technology.

Figure 8:
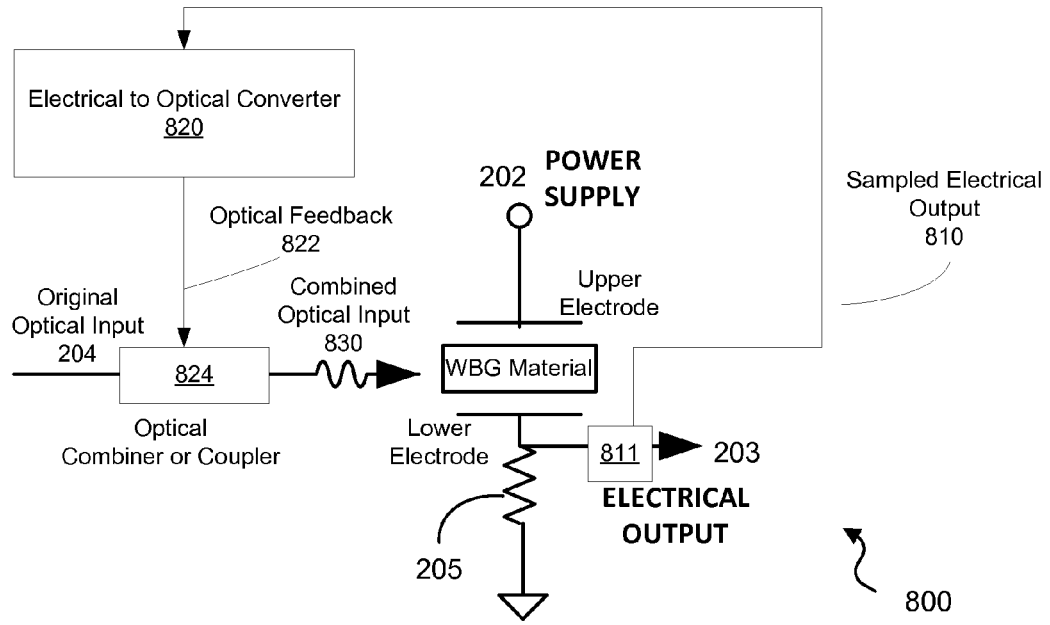
FIG. 8 shows an example of a self-sustained oscillator circuit based on the disclosed technology.

FIG. 8 shows an example of an oscillator circuit 800 based on the follower circuit in FIG. 2A. The electrical output 203 of the follower circuit in FIG. 2A is split by an electrical signal splitter or coupler 811 to produce a sampled electrical output 810 as the electrical feedback signal for the oscillator circuit 800. An electrical to optical converter 820 is provided to convert the electrical feedback signal 810 into an optical feedback signal 822. The electrical to optical converter 820 may include, for example, an optical emitter such as a diode laser to generate the optical feedback signal 822 in response to the received electrical feedback signal 810. An optical combiner or coupler 824 is provided to combine the original optical input 204 and the optical feedback signal 822 to produce a combined optical input 830 for the oscillator circuit 800. This combined optical input 830 is fed into the WGB material to control the electrical conduction of the WGB material in the follower circuit.

Under this design in FIG. 8, a closed signal loop is formed by the WGB material, the lower electrode, the circuit 205, the electrical output 203, the electrical signal splitter 811, the electrical to optical converter 820, the optical combiner or coupler 824 and the WGB material. This closed signal loop is a hybrid signal loop having (1) an optical section between the electrical to optical converter 820 and the WGB material and (2) an electrical section between the WGB material and the electrical to optical converter 820. When the total loop gain of this closed loop is greater than the loss and the feedback of the feedback loop is in phase, it is possible to initiate and sustain a self-oscillation by sampling the output and converting that output to an optical modulation which is applied in a regenerative way to the combined optical input 830 at the WGB material. Similarly, other oscillator circuits can be constructed based on the circuits in FIGS. 2B to 7.

The disclosed devices can be configured to operate a Wide Bandgap Transconductance Device (WBTD) which is capable to respond and amplify RF or microwave oscillations over a very wide frequency range while not necessarily requiring the use of tuned circuits for efficiency. For a given system output, the lower frequency limit is essentially unlimited and the upper frequency limit is generally only limited by the material properties. In some implementations, these material limitations are generally observed to be in the sub-nanosecond range and thus the upper frequency limit can be well above 1 GHz. Accordingly, the full bandwidth of such a device can likewise be over 1 GHz. Further, because the devices are inherently ultra-compact, high-power devices, they can replace vacuum tube or arrays of multiple transistors that form high power transmitting systems.

In a transmitting system used for the communication of different forms of data, for example, channels can be set up that are offset by some arbitrary amount ($\Delta f_k$, where k=1, 2, 3, . . . , N) from a particular center frequency ($f_o$). This center frequency is considered to be the "main carrier" frequency and multiple channels can then be set up at frequencies of $f_o+/-\Delta f_k$. Channels can be as close together as necessary so long as detection at the receiver is not inhibited. In general practice, the amount of frequency separation is roughly twice the data transmission rate. Thus, for transmitting a large number of channels from a single system requires that the vacuum tube or arrays of multiple transistors be of sufficiently wide bandwidth that all channels can be transmitted without severe attenuation.

There are other methods that can be used to increase the amount of information on a particular channel. Such techniques include using digital methods, data compression, combining interleaved high speed data packets with identifiers to differentiate each packet, and the like. But even with these techniques, the final limitation is associated with the number of channels that can be realized within the band.

Figure 9:
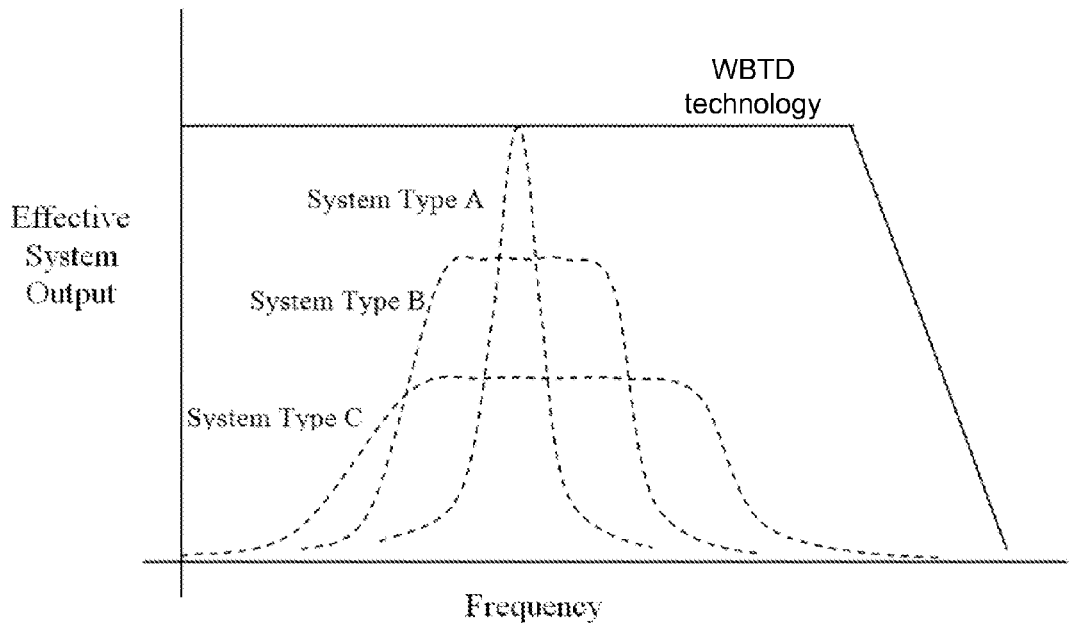
FIG. 9 shows a plot depicting examples of signals having different bandwidths.

Most conventional RF and microwave systems use "tuned circuits" to ensure adequate and efficient amplification in each stage. The problem with this approach is illustrated in FIG. 9, showing a diagram plot depicting signals having different bandwidths. For example, if a highly efficient narrow band system (Type A) can be realized for the transmitting a single channel at $f_o$, Type B system illustrates what would occur if that same system was refashioned to allow the transmission of multiple channels. Type C system illustrates what would occur if still more channels were transmitted from the same system. Thus it is clear that for a given conventional system, broadening the frequency capability to enable the accommodation of increased channels adversely impacts the ability of that system to amplify efficiently. Designers often accommodate this existing limitation by using multiple parallel transmitting devices, each offset by some frequency and all fed into an antenna array.

Using the disclosed technology, efficient amplification does not necessarily require the device to be tuned to a particular frequency to operate with minimum loss. The disclosed techniques allow the realization of a very broadband system capable of receiving a very large number of data streams as input and then transmitting those streams using RF or microwave frequencies (as shown by the solid line in FIG. 9). One exemplary advantage of this technique is that multiple separate parallel systems so as to effectively broaden the full system bandwidth are no longer required. Thus a more compact system can be realized. Further, because fewer systems are required, the electrical efficiency of the overall system also increases.

Take, for instance, the "Mobile Band GSM-850" that uses the 869-894 MHz frequency range for the so called "downlink" from a transmitting tower to the mobile receiver. Using the disclosed techniques, this bandwidth of 25 MHz can be easily accommodated in a single system. Moreover, the very same design could easily accommodate all mobile frequencies used throughout the world from T-GSM-380 (390 MHz) to T-GSM-900 (921 MHz).

Figure 10:
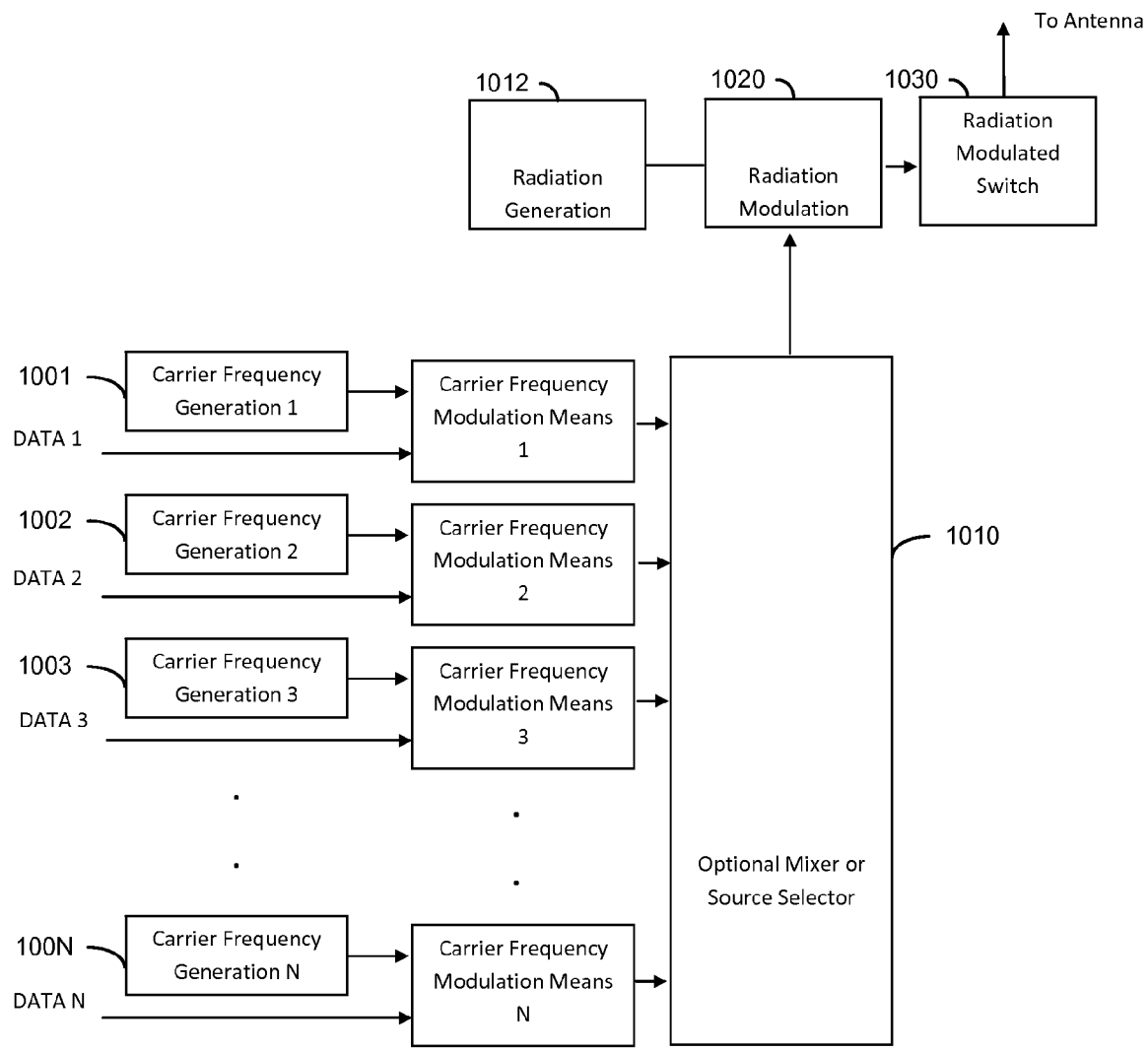
FIG. 10 shows a block diagram of an exemplary multi-carrier communication system transmitter.

FIG. 10 shows a diagram of an exemplary multi-carrier communication system transmitter. In some implementations, the channels are formed by imposing the data onto a particular carrier frequency channel ($f_o+/-\Delta f_k$). For example, a carrier frequency channel is generated by the device 1001 designated as "Carrier Frequency Generation 1" and is a low level oscillator operating at a frequency within the specified bandwidth of the system. Other carrier frequency channels of the exemplary multi-carrier communication system transmitter can be generated by other devices 1002, 1003, . . . 100N. It is important to note that the quantity $\Delta f_k$ need not be constant but in fact can vary in real time in coordination with the other channels so as to optimize the number of channels that one band can accommodate. The data to be transmitted in a frequency channel is provided as input to a corresponding signal modulator for that frequency channel. FIG. 10 shows different signal modulators for different frequency channels, for example, the signal modulator for the first frequency channel is designated as "Carrier Frequency Modulation Means 1" as shown. The modulator modulates the carrier frequency channel using, for example, phase, frequency, or amplitude modulation. In some implementations, the system can optionally include a mixer or source selector 1010 to receive the modulated signals from the Carrier Frequency Modulators 1, 2, 3, . . . N and mix and/or select such signals to provide to a radiation modulator 1020.

The radiation modulator 1020 receives the output from one or more carrier frequency modulators as a modulated electrical signal and applies the modulated signal to cause a modulation of the received radiation from the radiation generation source 1012. The radiation modulator 1020 produces a modulated radiation signal to the radiation modulated switch 1030 which is constructed by using a WBG photoconductive material as shown in FIG. 1. The disclosed WBTDs can transmit the modulated signal by, e.g., an antenna. For instance, if soft x-rays were used to modulate the wide bandgap material in the switch 1030, a grid fashioned within a triode type structure would serve as the radiation source 1012 and also the modulation device 1020.

Figure 11A:
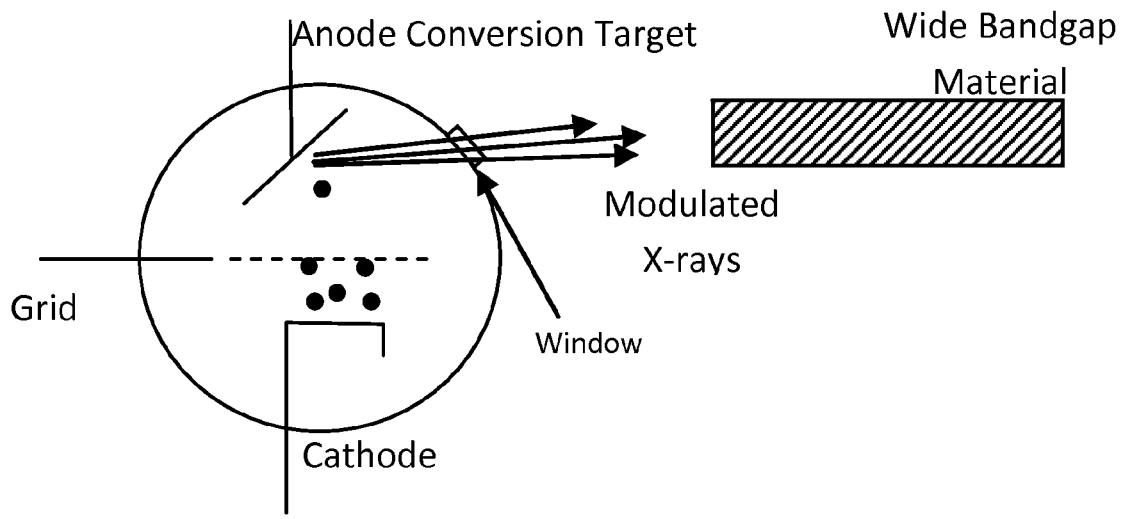
FIGS. 11A and 11B show diagrams depicting exemplary wide bandgap device configurations.
Figure 11B:
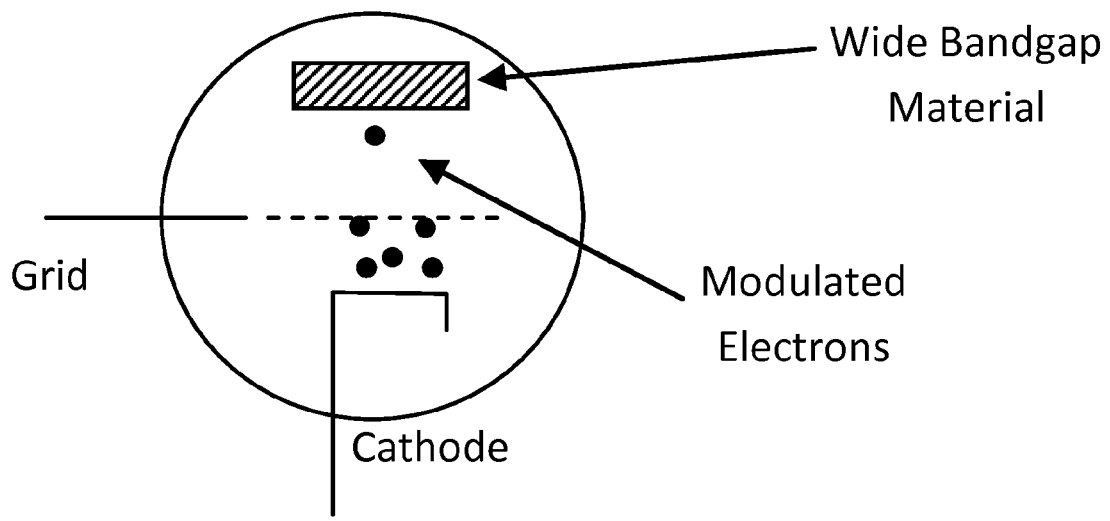

Two examples of a combination of a radiation source 1012 and a radiation modulator 1020 of FIG. 10 are shown in FIGS. 11A and 11B. In FIG. 11A, an X-ray generator is modulated to produce modulated X-rays directed to a separate WBG material which is part of the radiation modulated switch 1030 in FIG. 10. FIG. 11B shows an implementation which provides simplification of such a device by enclosing both the wide bandgap material within the same envelope as the radiation generation and modulation means and using either the electrons or even the soft x-rays from a similar target as in FIG. 11A.

In one exemplary advantageous use of the property of these wide bandgap materials, this modulated radiation, when applied to the wide bandgap material, can cause the current through the material to vary in similar manner. As these currents can be sufficiently high (e.g., ~kA/cm$^2$) in addition to the material's ability to sustain very high fields (e.g., ~300 MV/m), extremely high power can be realized in a very compact package. Further, combining the broadband capability with this power capability enables a very compact data transmission system.

To increase the number of channels in such a device, the separate channels need only be combined so as to prevent the interaction of individual channels with each other. Methods such as mixers or active source selectors can be used to accomplish this task.

Although soft x-rays and electrons are described here, as shown in FIGS. 11A and 11B, any radiation that can sufficiently excite the charge carriers in the wide bandgap material can be used. For example, much local and telecommunication switching takes advantage of optical fiber. An advantage of this technique is that of the amount of data throughput that can be realized from such a technology.

For example, many fiber systems use radiation at center frequencies generally near the optical range or roughly 1015 Hz. Because of the generally low rate of data transmission relative to this high of frequency, the required bandwidth for general data transmission is insignificant compared to this frequency. Thus, for a center frequency of this magnitude, there is little or no fundamental limitation on the number of channels that can be realized from this method.

In practice, this multiplexing method is referred to as Wavelength Division Multiplexing (WDM). In similar fashion, as described earlier, except optically, multiple data streams modulate distinct and separate optical carrier frequencies. These individual frequencies are then combined and injected into a single fiber. In some systems, these optical signals are routed to an appropriate central transmitting system and are separated by optical carrier frequency. After separation, the resultant modulation is detected (i.e., de-modulation) and each individual channel of information is reapplied to separate RF or microwave carrier channels by an array of modulators. These channels are then received by separate mobile receiver.

Figure 12:
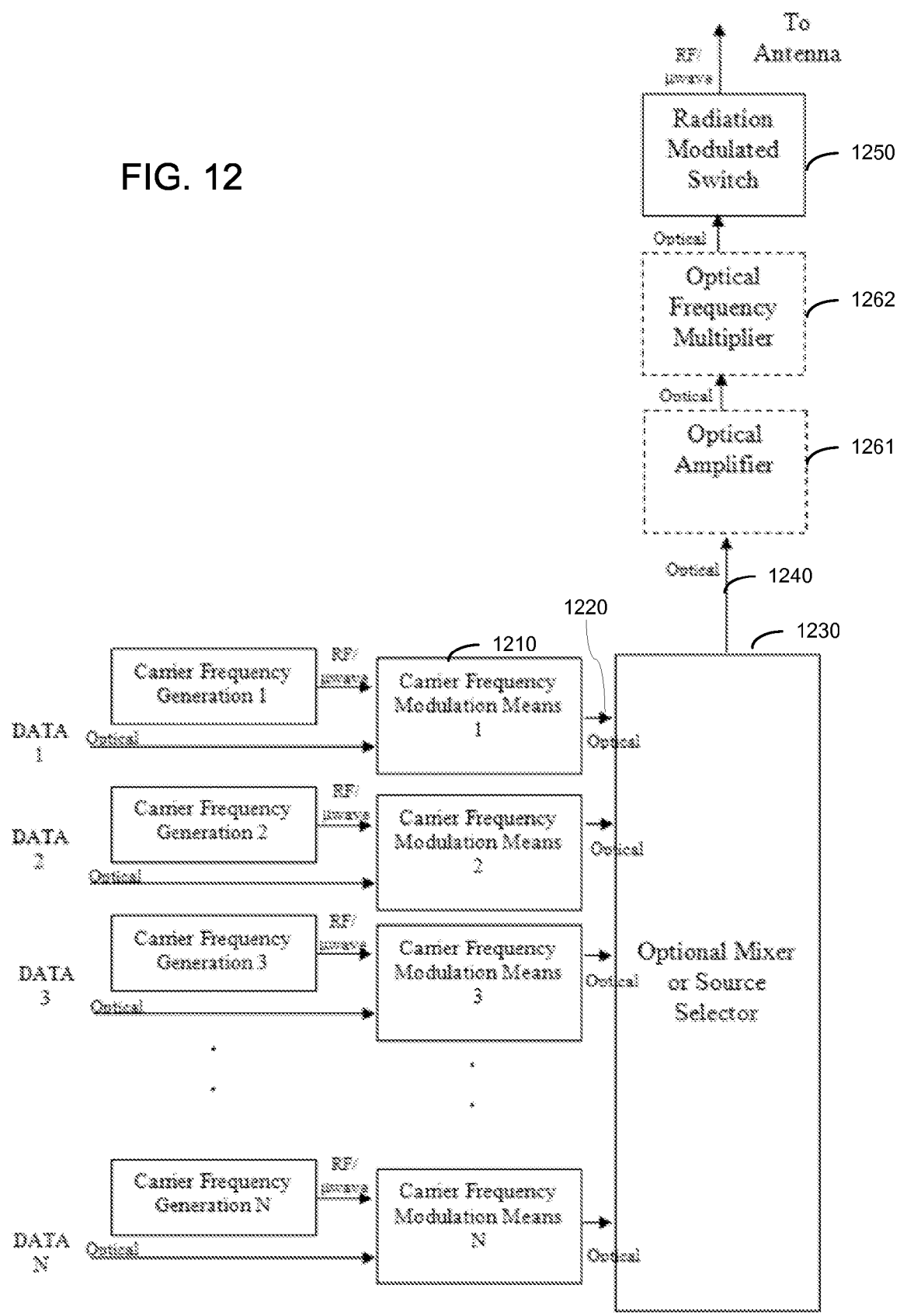
FIG. 12 shows a block diagram of an exemplary digital communication system.

The advantage of the aforementioned technique, however, is that data may also be received in the form of optical energy from the fiber and be directly converted to RF or microwave energy without a separate demodulation-re-modulation step. In this particular case, the desired channel frequency is used to modulate the optical signal that has already been modulated with the data and received at the central transmitting system. This modulated optical signal can then be mixed as previously described, but since the information output from the modulator is already in the form of radiation (i.e., optical radiation), it can be applied directly to a WBTD as shown in FIG. 12. Thus, the conventional intermediate stages required for optical demodulation and subsequent RF/microwave modulation are eliminated, creating greater simplification of the overall system.

More specifically, FIG. 12 shows the use of carrier frequency modulators 1, 2, . . . , N, which are optical modulators 1210, to modulate optical channels signals DATA 1, DATA 2, . . . , DATA N, respectively, in response to their respective RF or microwave carrier frequencies. The modulated optical signals 1220 output by the carrier frequency modulators 1210 (1, 2, . . . , N) are directed into the optical mixer or an optical source selector 1230 to produce an optical output 1240, which can be directly coupled to a radiation modulated switch 1250 (e.g., such as the exemplary WBTDs of the disclosed technology). Also shown in FIG. 12 is an optional optical amplifier 1261 for amplification if the optical energy from the fiber is too low, and also an optional optical frequency multiplier 1262 for increasing the optical frequency to a more optimum one based on the requirements of the WBTD. Examples of technologies for the modules 1261 and 1261 include Erbium based amplifiers for implementing the optical amplifier 1261 and Lithium Niobate or KTP frequency multiplying crystals for implementing the optical frequency multiplier 1262.

Although modulation of a particular optical or RF/microwave channel can take many forms in practice, there is a generalized method of describing such an operation mathematically. The basic types of modulation are Amplitude Modulation (AM), Frequency Modulation (FM), and Phase Modulation (PM) and can be mathematically described as:

$$f(t)=A(t)\cos[\omega t+\theta(t)]$$

Figure 13:
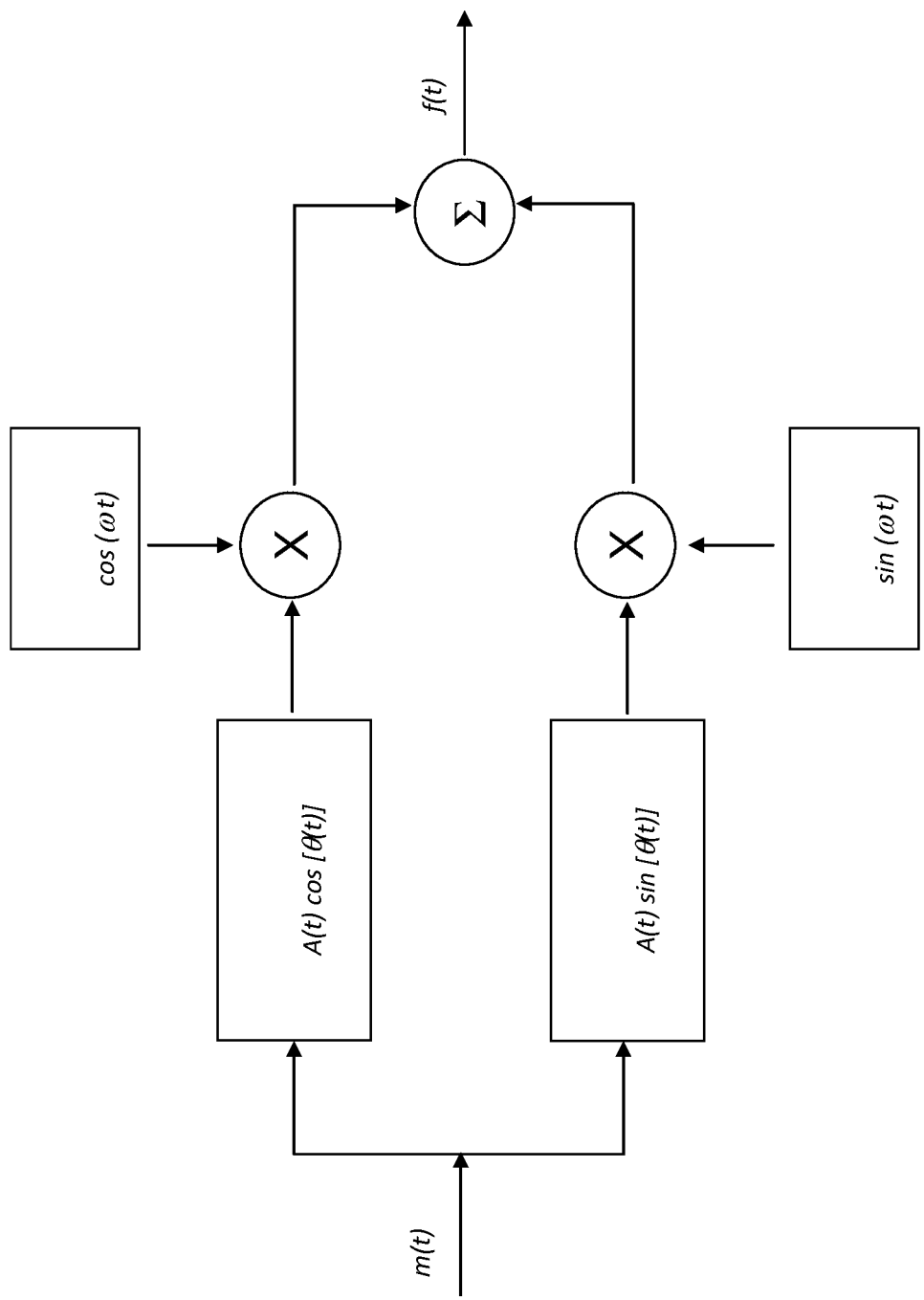
FIG. 13 shows a diagram of an exemplary analog communication circuit.

If m(t) is the modulation function, then for:
AM: $A(t) \propto m(t)$ and $\theta(t)$=constant
FM: $A(t)$=constant and $\theta(t) \propto \int m(\tau)d\tau$
PM: $A(t)$=constant and $\theta(t) \propto m(t)$ Functionally, these equations can be physically realized in the analog equivalent as shown in FIG. 13, which shows a diagram of an exemplary analog communication circuit based on the aforementioned modulation function.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An electronic device, comprising:
an electrical power supply;
a first electrode coupled to the electrical power supply;
a second electrode separated from the first electrode;
a wide bandgap photoconductive material located between and in contact with the first and second electrodes and responsive to input radiation to change an electrical conductivity of an electrical path between the first and second electrodes through the wide bandgap photoconductive material;
a radiation source that produces the input radiation received by the wide bandgap photoconductive material; and
an electrical to optical conversion device that receives a sample of an electrical output signal from the first or second electrode and converts the received sample of the electrical output signal into an optical signal that is applied with the input radiation into the wide bandgap photoconductive material to form a closed signal loop to sustain a self-oscillation in the electronic device.

2. The device as in claim 1, comprising:
an electrical load device between the second electrode and a ground,
wherein the electrical power supply, the first and second electrodes and the electrical load are coupled to produce a follower circuit whose output is generated at a location between the second electrode and the electrical load device.

3. The device as in claim 1, wherein the first electrode is coupled to a resistor which is further coupled to the electrical power supply, and the second electrode is coupled to a ground to effectuate an amplifier circuit whose output is between the first electrode and the resistor.

4. The device as in claim 1, further comprising:
a second electrical power supply coupled to the second electrode,
wherein the electrical polarities of the electrical power supply and the second electrical power supply are selected relative to each other to render the first and second electrodes, the wide bandgap photoconductive material, the electrical power supply and the second electrical power supply to form a bi-polar, balanced output, waveform generator.

5. The device as in claim 1, comprising:
a resistor between the second electrode and a ground,
wherein the electrical power supply, the first and second electrodes, and the resistor are coupled to form a follower circuit whose output is generated at a location between the second electrode and the resistor.

6. The device as in claim 1, comprising:
a resistor between the second electrode and a ground,
wherein the electrical power supply, the first and second electrodes, and the resistor are coupled to form a shunt type floating ground balanced waveform generator with outputs between the first electrode and the electrical power supply and between the second electrode and the resistor.

7. The device as in claim 1, comprising:
a first resistor between the first electrode and the electrical power supply, and a second resistor between the second electrode and a ground,
wherein the electrical power supply, the first and second electrodes, and the first and second resistors are coupled to form a shunt type floating ground balanced waveform generator with outputs between the first electrode and the first resistor and between the second electrode and the second resistor.

8. The device as in claim 1, comprising:
a second electrical power supply coupled to the second electrode,
a first resistor between the first electrode and the electrical power supply, and
a second resistor between the second electrode and the second electrical power supply,
wherein the electrical polarities of the electrical power supply and the second electrical power supply are selected relative to each other to enable the combination of the first and second electrodes, the wide bandgap photoconductive material, the electrical power supply and the second electrical power supply, and the first and second resistors to operate as a bi-polar, balanced output, waveform generator with outputs between the first electrode and the first resistor and between the second electrode and the second resistor.

9. The device as in claim 1, wherein the first electrode is coupled to an electrical load device which is further coupled to the electrical power supply, and the second electrode is coupled to a ground to effectuate an amplifier circuit whose output is between the first electrode and the electrical load device.

10. The device as in claim 1, configured to operate a wide bandgap transconductance device (WBTD) capable of responding and amplifying oscillations over a wide frequency range.

11. The device as in claim 10, wherein the WBTD is implemented as a part of a telecommunication system.

12. The device as in claim 10, wherein the WBTD is implemented as a component of a high power solid-state electronics.

* * * * *